(12) United States Patent
Ruething et al.

(10) Patent No.: US 9,543,405 B2
(45) Date of Patent: Jan. 10, 2017

(54) METHOD OF MANUFACTURING A REDUCED FREE-CHARGE CARRIER LIFETIME SEMICONDUCTOR STRUCTURE

(71) Applicant: Infineon Technologies AG, Neubiberg (DE)

(72) Inventors: Holger Ruething, Munich (DE); Hans-Joachim Schulze, Ottobrunn (DE); Frank Hille, Munich (DE); Frank Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 14/228,330

(22) Filed: Mar. 28, 2014

(65) Prior Publication Data

US 2014/0213022 A1 Jul. 31, 2014

Related U.S. Application Data

(62) Division of application No. 12/267,793, filed on Nov. 10, 2008, now abandoned.

(51) Int. Cl.
| | |
|---|---|
| *H01L 29/73* | (2006.01) |
| *H01L 29/66* | (2006.01) |
| *H01L 29/32* | (2006.01) |
| *H01L 29/739* | (2006.01) |
| *H01L 27/06* | (2006.01) |
| *H01L 29/167* | (2006.01) |

(52) U.S. Cl.
CPC ......... *H01L 29/66348* (2013.01); *H01L 29/32* (2013.01); *H01L 29/7397* (2013.01); *H01L 27/0611* (2013.01); *H01L 29/167* (2013.01)

(58) Field of Classification Search
None
See application file for complete search history.

(56) References Cited

U.S. PATENT DOCUMENTS

| 5,360,984 A | 11/1994 | Kirihata |
| 6,404,045 B1 | 6/2002 | Pelly |
| 8,748,975 B2 * | 6/2014 | Fujiwara ........... H01L 29/66666 257/330 |

(Continued)

FOREIGN PATENT DOCUMENTS

DE 102005018366 11/2005

OTHER PUBLICATIONS

Vobecky et al, "Free-Wheeling Diodes with Improved Reverse Recovery by Combined Electron and Proton Irradiation," Proceedings of the 8th PEMC, Sep. 8-10, 1998, pp. 1-4.

(Continued)

*Primary Examiner* — Benjamin Sandvik
(74) *Attorney, Agent, or Firm* — Murphy, Bilak & Homiller, PLLC

(57) ABSTRACT

A method of manufacturing a reduced free-charge carrier lifetime semiconductor structure includes forming a plurality of transistor gate structures in trenches arranged in a semiconductor substrate, forming a body region between adjacent ones of the transistor gate structures and forming an end-of-range irradiation region between adjacent ones of the transistor gate structures, the end-of-range irradiation region having a plurality of vacancies.

19 Claims, 17 Drawing Sheets

(56) References Cited

U.S. PATENT DOCUMENTS

| | | | |
|---|---|---|---|
| 9,012,311 B2* | 4/2015 | Pfirsch | H01L 21/221 257/612 |
| 9,379,181 B2* | 6/2016 | Sugimoto | H01L 29/0653 |
| 9,419,080 B2* | 8/2016 | Laven | H01L 29/1095 |
| 2003/0057522 A1* | 3/2003 | Francis et al. | 257/566 |
| 2005/0006796 A1 | 1/2005 | Falster | |
| 2005/0258493 A1 | 11/2005 | Aono et al. | |
| 2006/0073684 A1 | 4/2006 | Schulze et al. | |
| 2007/0108468 A1 | 5/2007 | Takahashi | |
| 2007/0114598 A1* | 5/2007 | Hotta et al. | 257/330 |
| 2007/0231973 A1 | 10/2007 | Ruething et al. | |
| 2009/0283799 A1 | 11/2009 | Ruething et al. | |
| 2010/0270585 A1* | 10/2010 | Rahimo | H01L 21/266 257/139 |

OTHER PUBLICATIONS

Helmund et al, "Optimize Losses in Soft-Switching Applications," Electronic Engineering Times—Asia, Nov. 1-15, 2008, pp. 1-2.

\* cited by examiner

METHOD OF MANUFACTURING A REDUCED FREE-CHARGE CARRIER LIFETIME SEMICONDUCTOR STRUCTURE

PRIORITY CLAIM

This application is a divisional of U.S. patent application Ser. No. 12/267,793 filed 10 Nov. 2008, the content of said application incorporated herein by referent in its entirety.

BACKGROUND

Insulated-Gate Bipolar Transistors (IGBTs) are three-terminal power semiconductor devices that combine the gate-drive characteristics of a Metal Oxide Semiconductor Field-Effect Transistor (MOSFET) with the high-current and low-saturation-voltage capability of a bipolar transistor. Modern IGBT devices are formed by integrating an FET and a bipolar power transistor on the same silicon die. The FET functions as a control input while the bipolar power transistor is used as a switch. IGBTs efficiently switch electric power in many applications such as electric motors, variable speed refrigerators, air-conditioners, etc. However, these applications have considerably high inductive loads which cause the current to flow in the reverse direction of the switch. If this reverse current is commutated into the IGBT, the device will be destroyed. Therefore diodes are connected anti-parallel to conduct the current and thereby protect the IGBT.

One technique to enable the IGBT to conduct the reverse current is to integrate a freewheeling diode into the IGBT device. The collector electrode of the IGBT is divided into different regions of n and p-type material. The p-type regions form the IGBT collector. The n-type regions, in conjunction with the n-type drift zone of the IGBT device, form a freewheeling diode with the p-body and a heavily doped p-type emitter contact region of the IGBT device.

Integrating a freewheeling diode with an IGBT device can create some problematic conditions. Mainly, power continues to dissipate in a freewheeling diode in conduction mode even after the diode has been reverse biased. Current will continue to flow until the diode reaches a steady-state reverse bias condition. The condition when the diode changes from forward conduction to blocking is commonly referred to as Reverse Recovery. The Reverse Recovery Charge (RRC) causes the integrated freewheeling diode to incur electrical losses. These electrical losses increase when the diode is integrated in the IGBT. Some applications cannot tolerate elevated temperature and/or power conditions. In addition, elevated temperature and power consumption reduce IGBT lifetime.

Electrical losses caused by integrating a freewheeling diode with an IGBT device can be lowered by reducing the RRC of the diode. Diode RRC can be lowered by reducing the concentration of free-charge carriers within the IGBT device in diode mode. Most free-charge carriers originate within the IGBT device from the highly doped emitter contact region of the device. This highly doped region injects free-charge carriers into the drift zone of the IGBT device in diode mode. Accordingly, the diode RCC can be reduced by lowering the doping concentration of the highly doped emitter contact region. However, this significantly reduces the latch-up robustness of the IGBT device, which is not a practical solution for most IGBT applications because IGBT performance degrades.

A local reduced charge-carrier lifetime region can be formed in the drift zone of the IGBT to reduce diode RRC. The reduced charge-carrier lifetime typically has a very low charge carrier lifetime to sufficiently reduce the RCC of the freewheeling diode integrated with the IGBT device. A single reduced charge-carrier lifetime region is typically formed by irradiating either the front or back side of the wafer on which the IGBT device and freewheeling diode are fabricated. The irradiation treatment may result in two zones being formed within the single reduced charge-carrier lifetime region. One zone has a charge carrier lifetime higher than that of the second zone, but lower than that of the non-irradiated part of the IGBT drift zone. However, the single region must still have a very low charge carrier lifetime to be effective at reducing diode RRC. Forming a very low charge carrier lifetime region in the drift zone of an IGBT increases the $V_{CESat}$ (collector-to-emitter saturation voltage) of the IGBT and also leakage current during blocking mode. Moreover, the circuit designer must still trade-off between high emitter efficiency and low diode RRC. Accordingly, forming a single reduced charge-carrier lifetime region conventionally yields a stored charge that is at least three times higher than that of a single non-freewheeling diode.

SUMMARY

According to an embodiment of a method of manufacturing a reduced free-charge carrier lifetime semiconductor structure, the method comprises: forming a plurality of transistor gate structures in trenches arranged in a semiconductor substrate; forming a body region between adjacent ones of the transistor gate structures; and forming an end-of-range irradiation region between adjacent ones of the transistor gate structures, the end-of-range irradiation region having a plurality of vacancies.

According to an embodiment of a method of manufacturing a power semiconductor device, the method comprises: providing a semiconductor substrate; forming a transistor gate structure in a trench arranged in the semiconductor substrate; forming a body region of a first conductivity type adjacent the transistor gate structure; forming a first highly-doped region of a second conductivity type in an upper portion of the body region; forming a drift zone of the second conductivity type below the body region; forming a second highly-doped region of the second conductivity type below the drift zone; and forming an end-of-range irradiation region adjacent the transistor gate structure, the end-of-range irradiation region having a plurality of vacancies.

Those skilled in the art will recognize additional features and advantages upon reading the following detailed description, and upon viewing the accompanying drawings.

DETAILED DESCRIPTION

Figure 1:
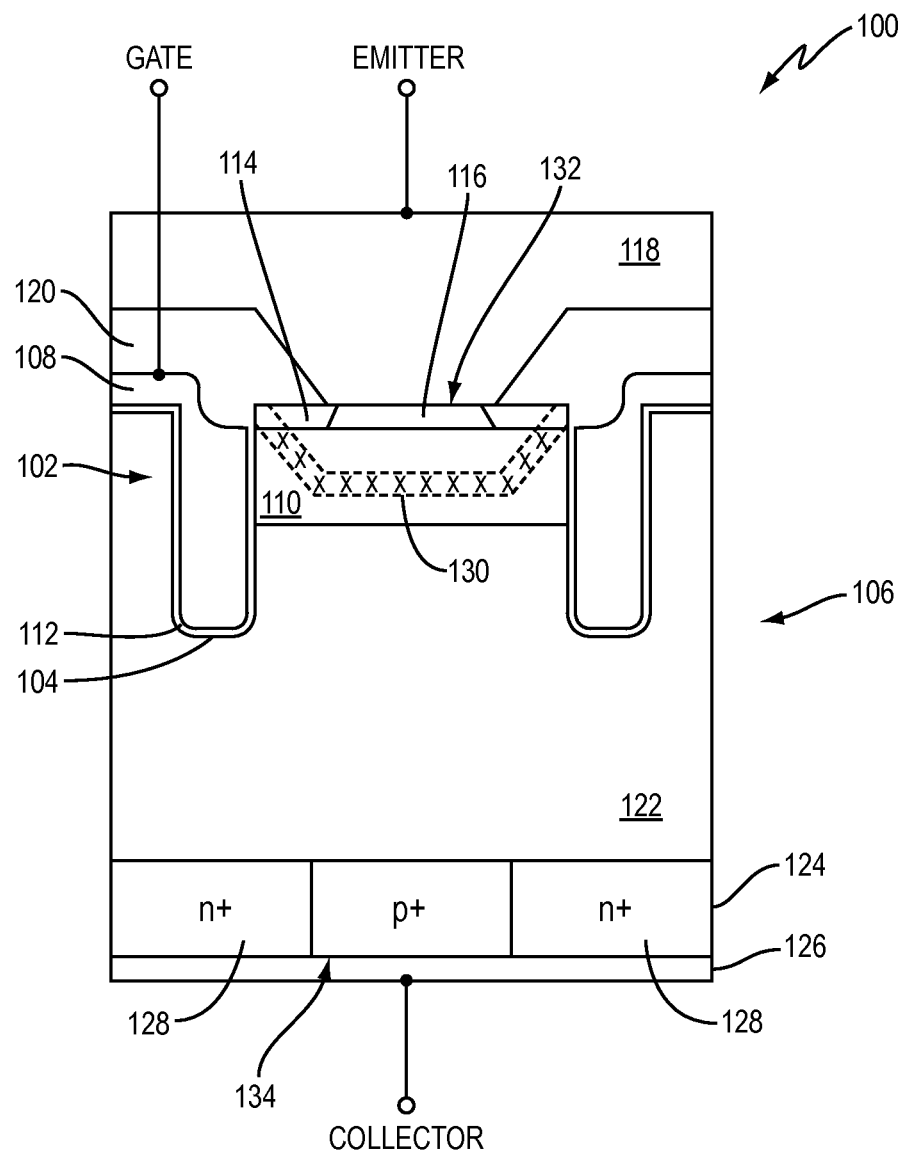
FIG. 1 is a cross-sectional view of an embodiment of a power semiconductor device including an end-of-range irradiation region arranged between adjacent transistor gate trench structures in a body region of the device.

FIG. 1 illustrates an embodiment of a power semiconductor device 100 including an Insulated-Gate Bipolar Transistor (IGBT) integrated with a freewheeling diode, together referred to herein as a reverse conducting IGBT (RC-IGBT). The IGBT has a transistor gate structure 102 arranged in trenches 104 formed in a semiconductor substrate 106. The transistor gate structure 102 includes a gate conductor 108 insulated from a body region 110 of the substrate 106 by a gate insulator 112 disposed on the inner walls of the trench 104. The body region 110 is of a first conductivity type (e.g., p-type) and is arranged adjacent the transistor gate structure 102. A source region 114 of a second conductivity type (e.g., n-type) is arranged in an upper portion of the body region 110. A highly-doped emitter contact region 116 of the first conductivity type is arranged in the body region 110 between the source regions 114 and is in contact with an emitter contact layer 118. The emitter contact layer 118 is isolated from the gate conductor 108 by an insulating layer 120 to ensure proper operation of the IGBT. A drift zone 122 of the second conductivity type is arranged below the body region 110. A highly-doped collector contact region 124 of the first conductivity type is arranged below the drift zone 122, separating the drift zone 122 from a collector contact layer 126 of the IGBT.

The freewheeling diode integrated with the IGBT has an anode at least partially formed by the body region 110 and highly-doped emitter contact region 116 of the IGBT. The cathode of the freewheeling diode is at least partially formed by one or more n-type regions 128 formed in the highly p-doped collector contact region 124. However, unless the RRC of the freewheeling diode is reduced, the diode may adversely affect IGBT performance. To this end, the semiconductor substrate 106 is irradiated at one or more different energy levels to form an end-of-range irradiation region 130 between adjacent ones of the transistor gate structures 102. The end-of-range irradiation region 130 is where the maximum decrease in charge carrier lifetime occurs.

Figure 2:
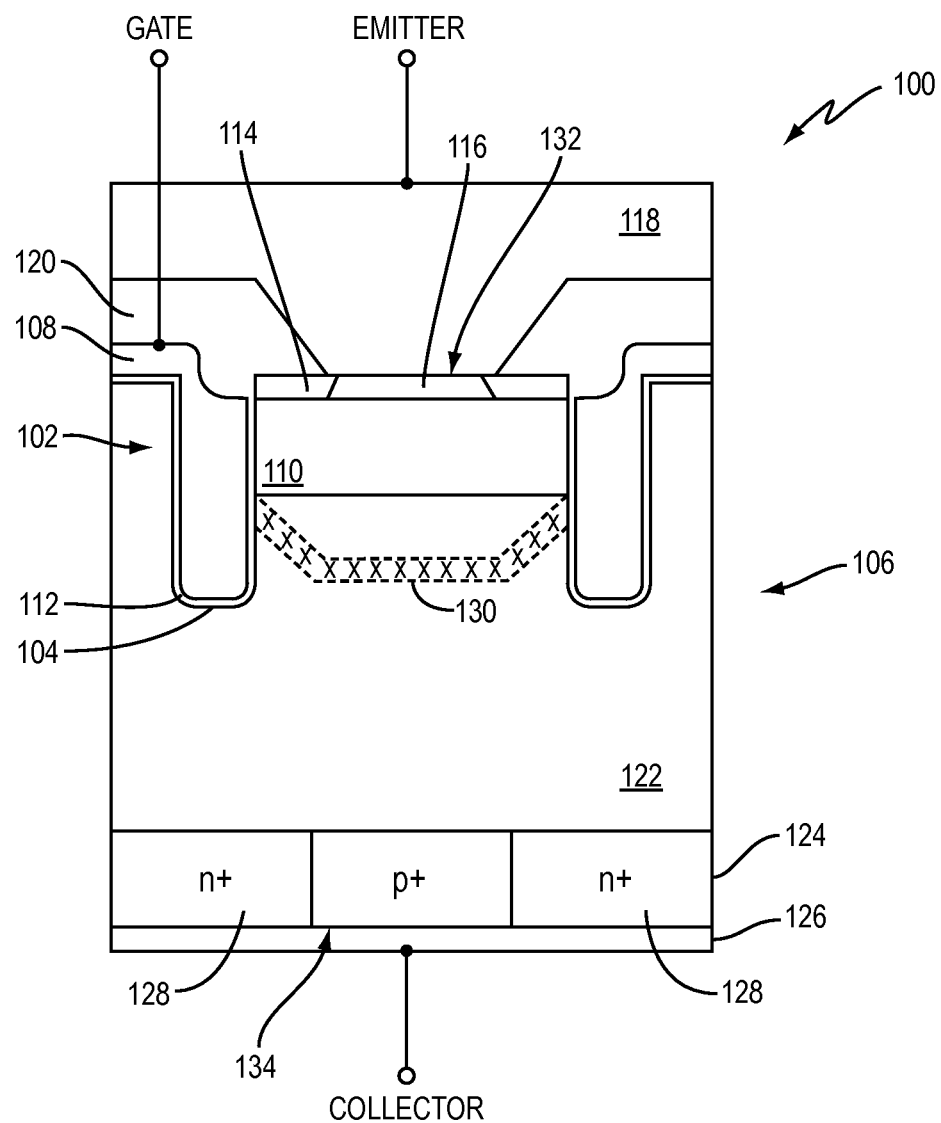
FIG. 2 is a cross-sectional view of another embodiment of a power semiconductor device including an end-of-range irradiation region arranged between adjacent transistor gate trench structures below a body region of the device.

In one embodiment, the end-of-range irradiation region 130 is arranged in the body region 110 of the device 100 between adjacent ones of the transistor gate structures 102 as shown in FIG. 1. FIG. 2 illustrates another embodiment of the power semiconductor device 100 where the end-of-range irradiation region 130 is arranged below the body region 110 between adjacent ones of the transistor gate structures 102. In either embodiment, the irradiation treatment employed creates a plurality of vacancies in the end-of-range irradiation region 130 denoted by label 'X' in the Figures. In some embodiment, at least some of the vacancies in the end-of-range irradiation region 130 are occupied by metals to improve the effectiveness of the end-of-range region 130 as will be described in more detail later. Various embodiments are described herein for forming the end-of-range irradiation region 130 between adjacent ones of the transistor gate structures 102.

Figure 3A:
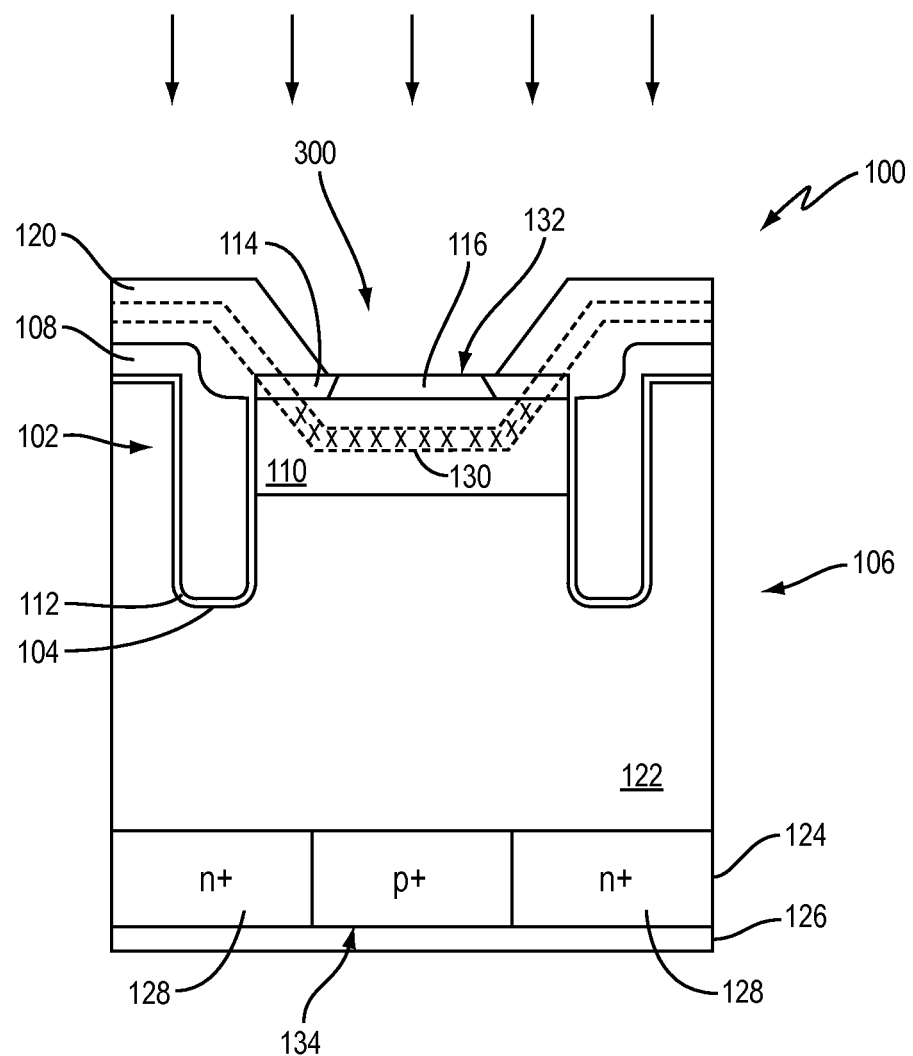
FIG. 3A and 3B are cross-sectional views of different embodiments of a power semiconductor device during formation of an end-of-range irradiation region arranged between adjacent transistor gate trench structures.
Figure 3B:
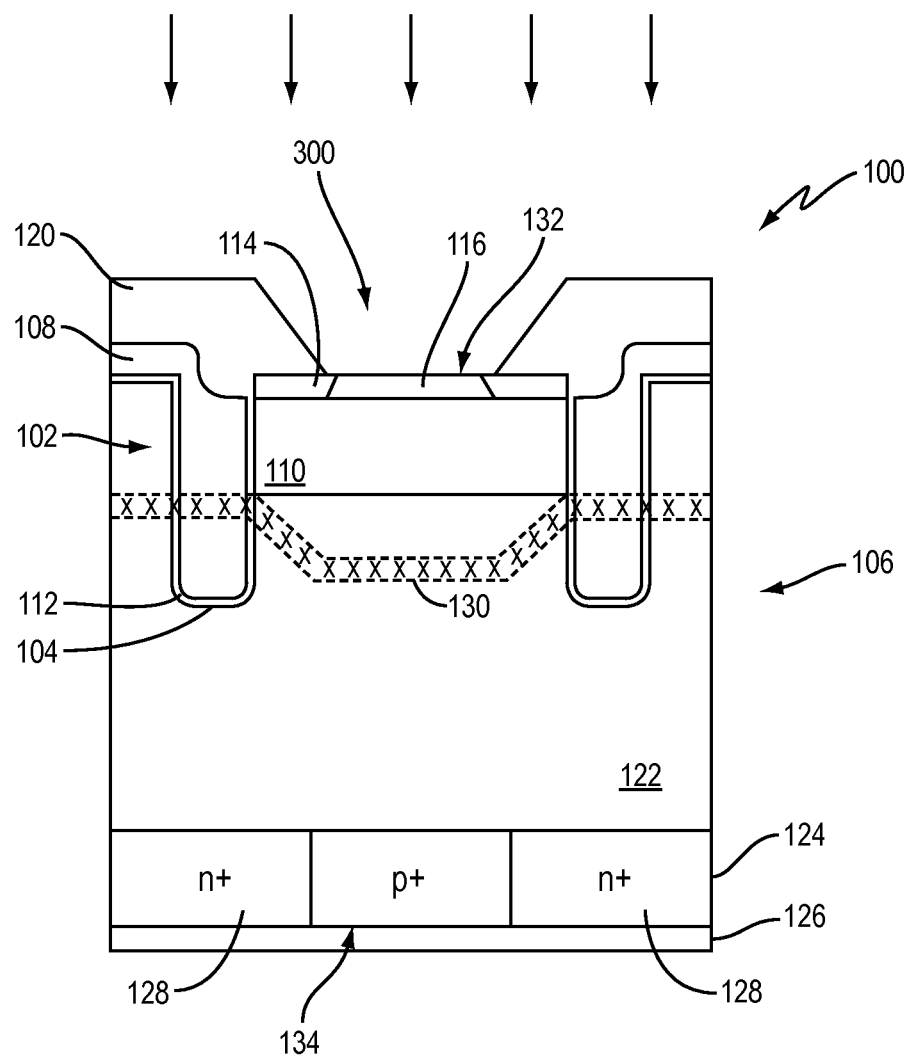

FIG. 3A illustrates one embodiment of forming the end-of-range irradiation region 130 by irradiating the semiconductor substrate 106 where arrows denote the irradiation treatment. Irradiation is performed before the emitter contact layer 118 is formed, e.g., using protons or helium. According to this embodiment, an opening 300 is formed in the insulating layer 120 that protects the IGBT transistor gate structure 102. The opening 300 is formed in a region of the insulating layer 120 arranged over the body region 110. Thus, the gate insulator 112 remains protected by the insulating layer 120 during the irradiation treatment. The opening 300 is subsequently used to form a contact between the emitter contact layer 118 and the highly-doped emitter contact region 116. Prior to forming the emitter contact layer 118, the substrate 106 is irradiated through the opening 300 formed in the insulating layer 120. In one embodiment, irradiation is performed at a relatively low energy level, e.g. proton irradiation at approximately 180 keV. Under these conditions, the end-of-range region 130 extends from the body region 110 into the insulating layer 120 as shown in FIG. 3A. In another embodiment, the irradiation is performed at a relatively high energy level of approximately 435 keV (e.g., proton irradiation), causing the end-of-range region to be formed below the body region 110 in the drift zone 122 as illustrated in FIG. 3B. In either irradiation energy embodiment, the end-of-range region 130 is arranged between adjacent ones of the transistor gate structures 102.

Figure 4:
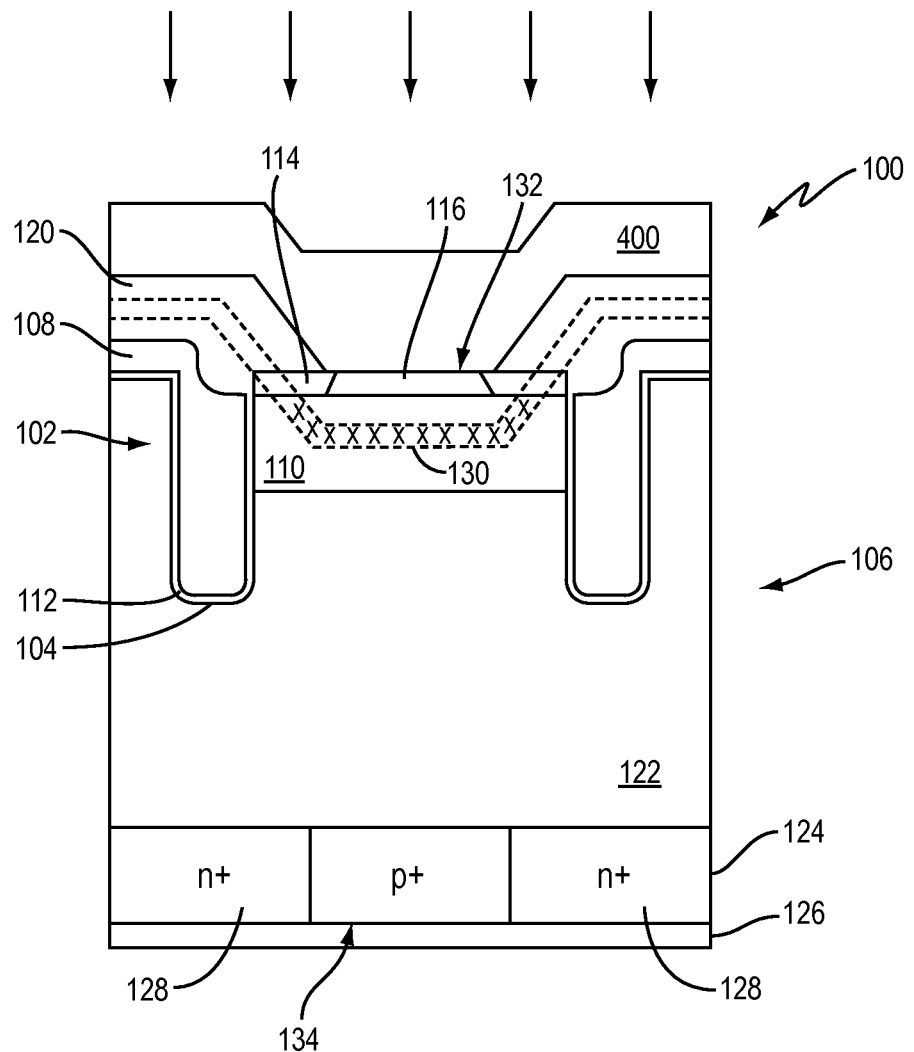
FIG. 4 is a cross-sectional view of another embodiment of a power semiconductor device during formation of an end-of-range irradiation region arranged between adjacent transistor gate trench structures.

FIG. 4 illustrates another embodiment of irradiating the semiconductor substrate 106 to form the end-of-range irradiation region 130 where the arrows denote the irradiation treatment. According to this embodiment, the opening 300 formed in the insulating layer 120 is used as a mask. A thick resist layer 400 is formed on the insulating layer 120. The optional layer 400 can be used when the end-of-range defects are generated by irradiation. Layer 400 prevents protons or Helium from damaging the gate insulator 112. This embodiment enables the use of a higher irradiation energy without changing the depth of the end-of-range irradiation region 130. In both the high and low irradiation energy cases (e.g., FIGS. 3 and 4), metal atoms (e.g. platinum or palladium) can be optionally integrated into the end-of-range vacancies as will be described in more detail later. The resulting end-of-range irradiation region 130 is where the freewheeling diode resides within the RC-IGBT. The end-of-range irradiation region 130 is formed in the body region 110 of the device 100 as shown in FIG. 4 when a relatively high irradiation energy level is used, where the irradiation energy level depends on the thickness of layer 400. Alternatively, the end-of-range irradiation region 130 can be formed below the body region 110 in the drift zone 122 as shown in FIG. 2 by using a relatively high irradiation energy level, e.g., approximately 435 keV.

Figure 5:
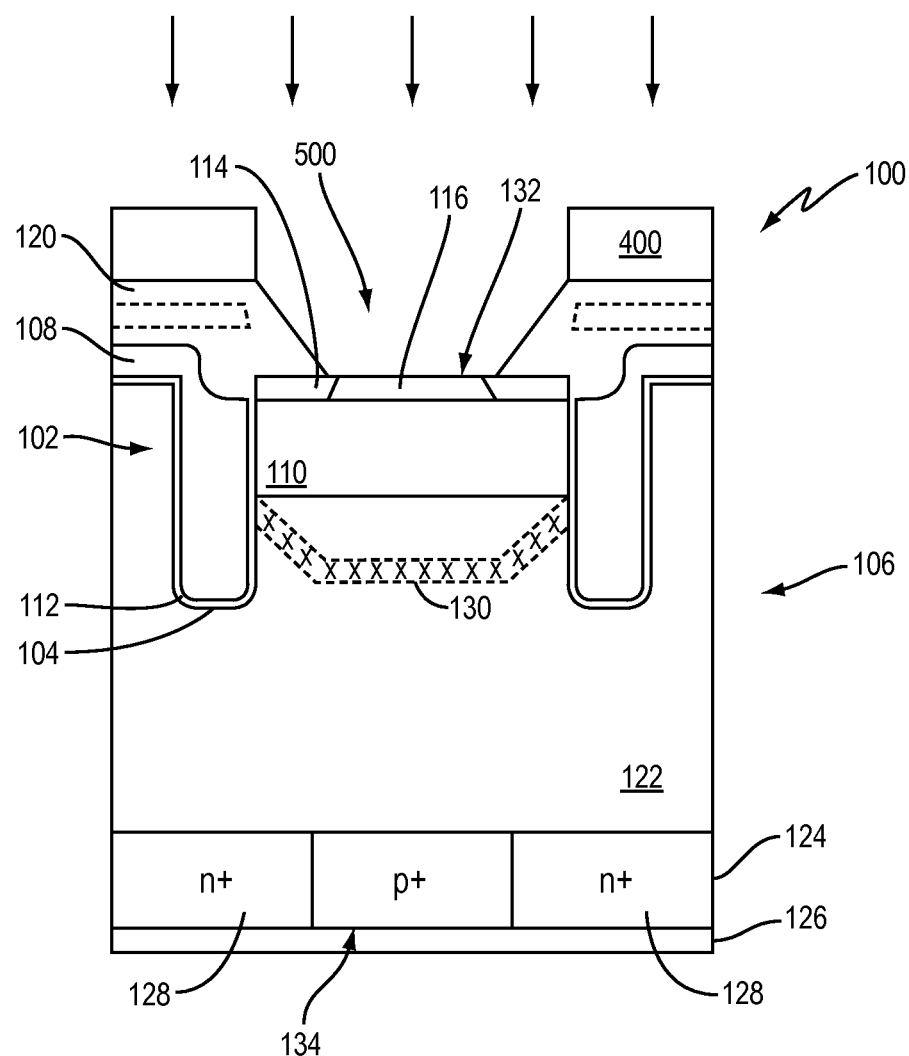
FIG. 5 is a cross-sectional view of yet another embodiment of a power semiconductor device during formation of an end-of-range irradiation region arranged between adjacent transistor gate trench structures.

FIG. 5 illustrates yet another embodiment of irradiating the semiconductor substrate 106 to form the end-of-range irradiation region 130 where the arrows denote the irradiation treatment. According to this embodiment, an opening 500 is formed in the optional resist layer 400. In one embodiment, the opening 500 is formed in the resist layer 400 in a region of the opening 300 formed in the insulating layer 120. This way, the gate insulator 112 is masked by both the resist layer 400 and insulating layer 120 during the irradiation treatment. An energy level of approximately 435 keV can be employed when the substrate 106 is irradiated through the openings 500, 300 formed in the resist and insulating layers 400, 120, respectively. As a result, the end-of-range irradiation region 130 is formed below the body region 110, but still between the trenches 104.

At least some of the vacancies in the end-of-range irradiation region 130, as indicated by label 'X' in the Figures, can be occupied by metals to increase the effectiveness of the end-of-range irradiation region 130. Metals can be diffused into the semiconductor substrate 106 before or after the semiconductor substrate 106 is irradiated, creating metal interstitials within the silicon lattice of the substrate 106. In one embodiment, metals are diffused into the substrate 106 at a temperature in the range of approximately 700° C. to 900° C. for a duration of approximately 30 to 120 minutes. The substrate 106 is then irradiated. An annealing of the substrate 106 in the range of approximately 600° C. to 800° C. for a duration of approximately 30 to 120 minutes causes the interstitial metal atoms to systematically integrate into the end-of-range vacancies created during irradiation. The annealing also repairs defects created during irradiation, particularly in the transistor gate structure 102 of the IGBT. In another embodiment the substrate 106 is irradiated, and then metals are diffused into the substrate 106 at a temperature in the range of approximately 600° C. to 800° C. for a duration of approximately 30 to 120 minutes. Described next are various embodiment for occupying vacancies in the end-of-range irradiation region 130 with metals.

Figure 6A:
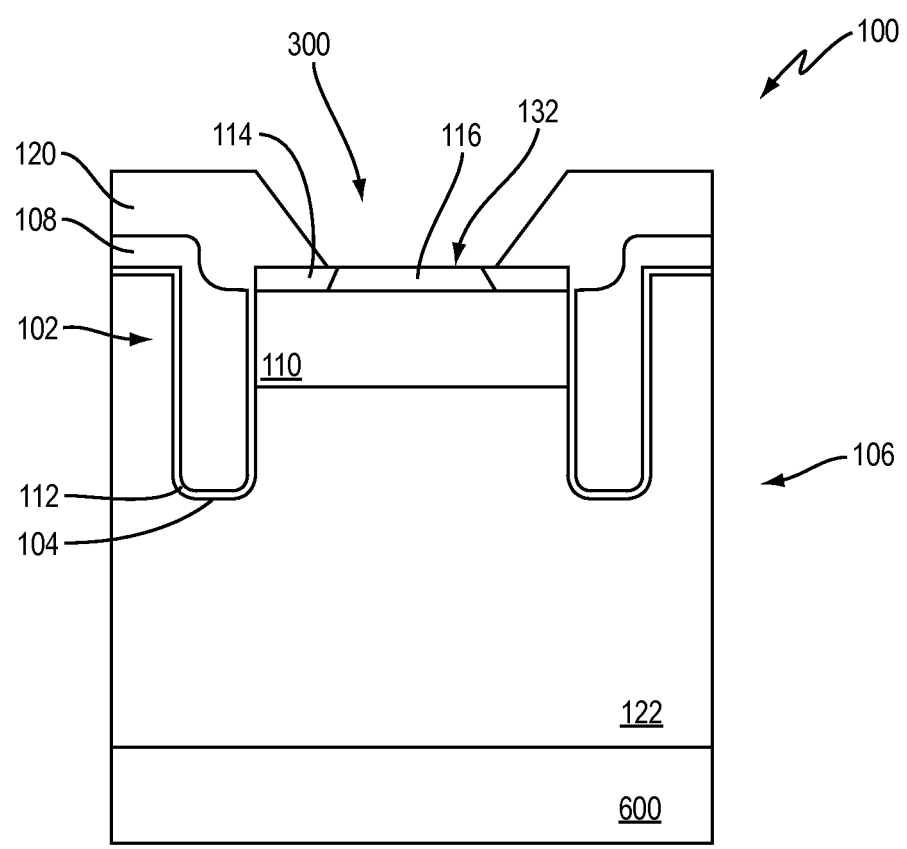
FIGS. 6A-6D are cross-sectional views of an embodiment of a semiconductor substrate during different stages of a metal diffusion process.
Figure 6B:
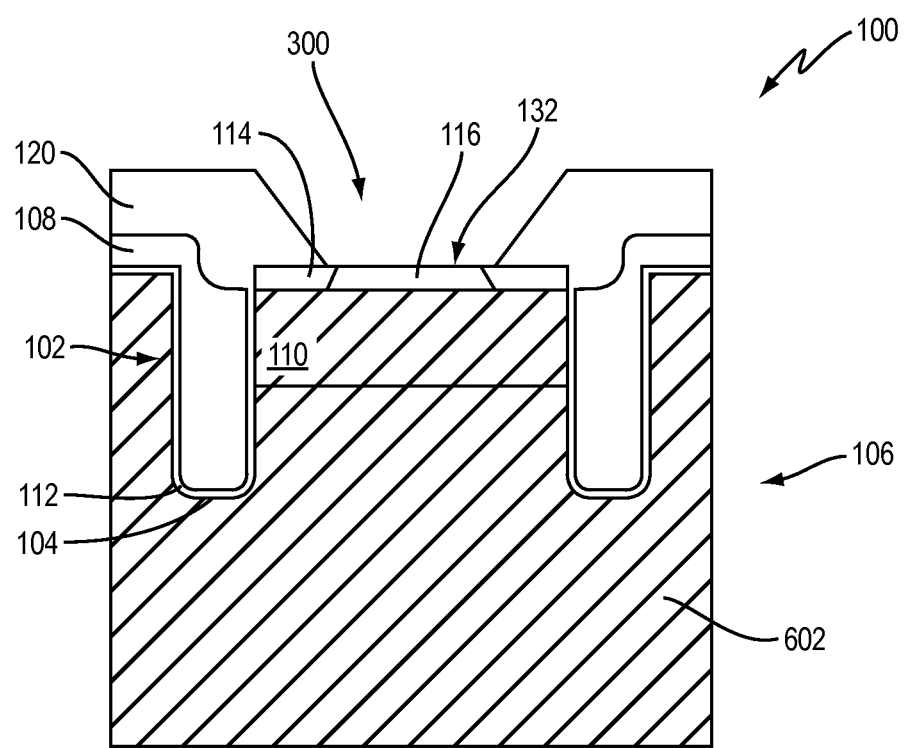
Figure 6C:
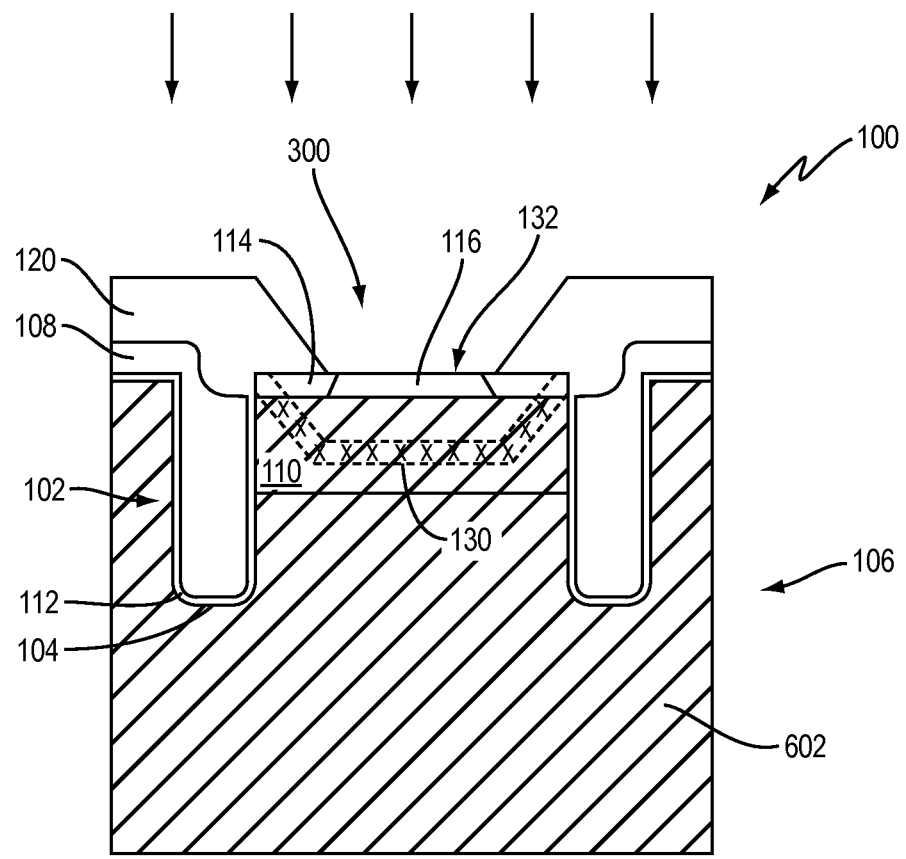
Figure 6D:
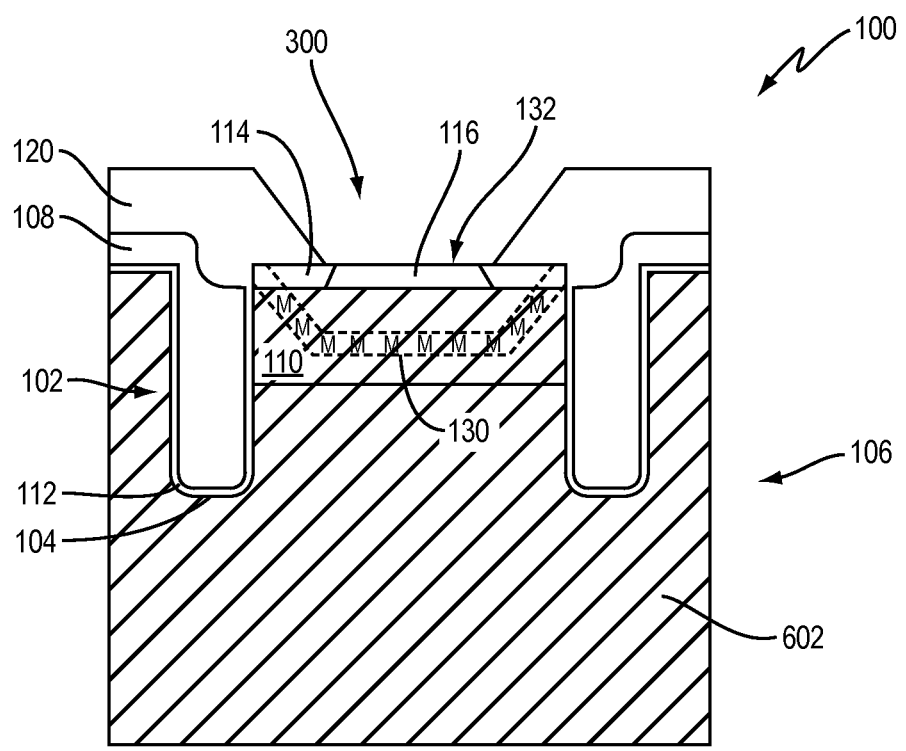

FIGS. 6A-6D illustrate one embodiment where metals such as platinum or palladium fill vacancies generated by an irradiation process. According to this embodiment, a metal silicide layer 600 is formed on the substrate 106 as shown in FIG. 6A. A diffusion process is then performed at a relatively low temperature, creating a substantial interstitial concentration 602 of metal atoms within the silicon lattice of the substrate 106 as shown in FIG. 6B. The metal silicide layer 600 is then removed and the substrate 106 irradiated at a relatively low energy level as indicated by the arrows in FIG. 6C to create end-of-range vacancies between adjacent ones of the trench structures 104 in the body region 110. The diffused metals occupy the end-of-range vacancies as indicated by label 'M' in FIG. 6D by performing a second diffusion process step at a higher temperature. The metal can also be implanted before the first diffusion process is performed. The following steps (e.g., irradiation, second diffusion) are the same as above. In yet another embodiment, the metal silicide layer 600 can be formed on the upper surface of the substrate instead of the lower surface. In each case, the end-of-range region 130 is formed in the body region 100 between the trenches 104 according to this embodiment.

Figure 7A:
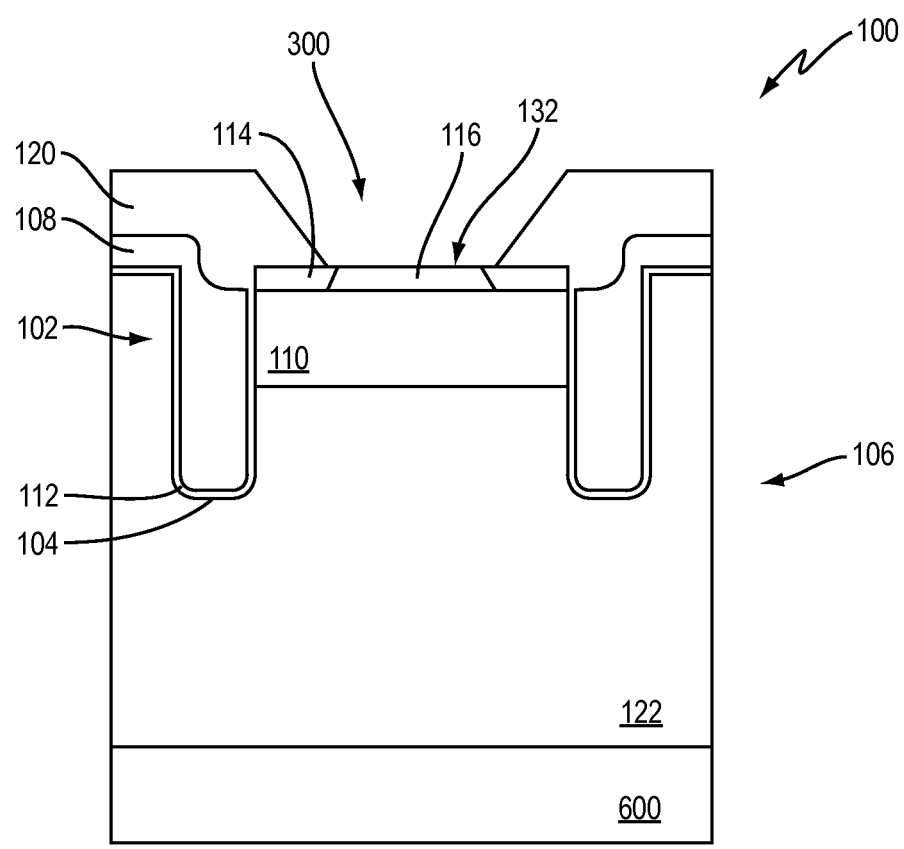
FIGS. 7A-7D are cross-sectional views of an embodiment of a semiconductor substrate during different stages of another metal diffusion process.
Figure 7B:
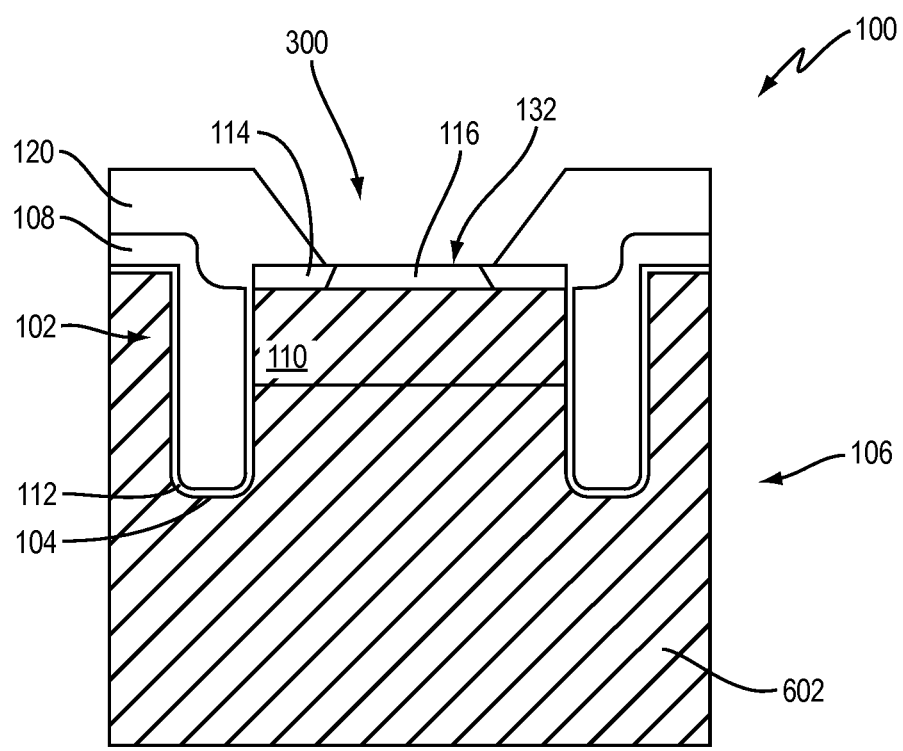
Figure 7C:
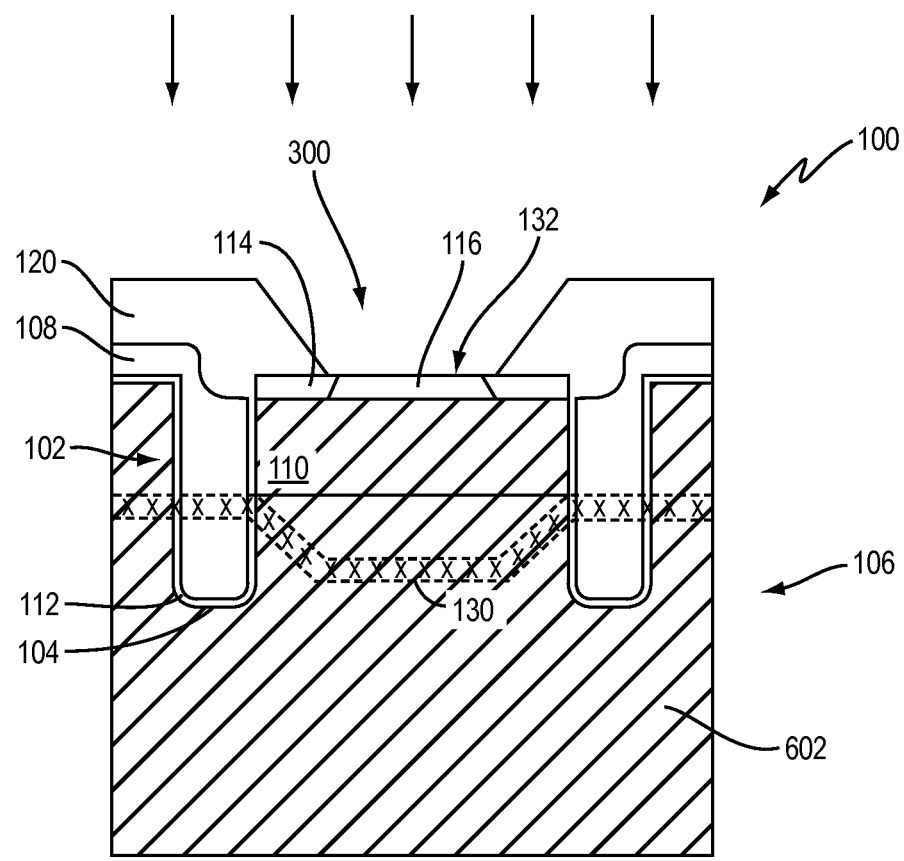
Figure 7D:
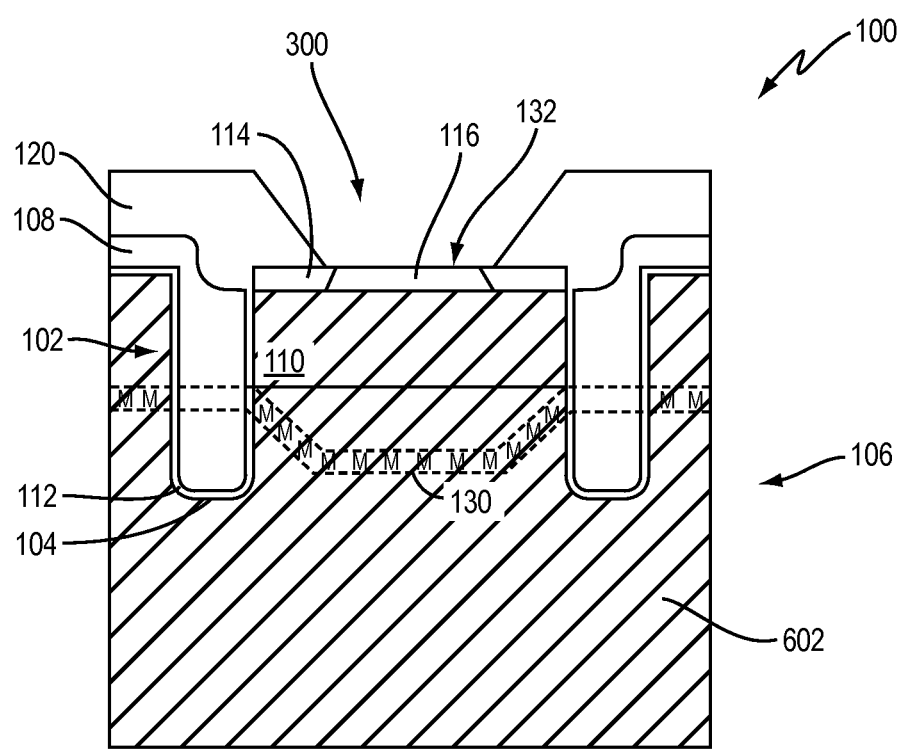

FIGS. 7A-7D illustrate another embodiment where metals such as platinum or palladium fill vacancies generated by an irradiation process. According to this embodiment, the metal silicide layer 600 is formed on the substrate 106 (FIG. 7A) and diffused at a relatively low temperature to create a substantial interstitial concentration 602 of metal atoms within the silicon lattice of the substrate 106 (FIG. 7B). The metal can also be formed on the upper surface of the substrate 106 or implanted before the first diffusion process as described above. Either way, the metal silicide layer 600 is then removed and the substrate 106 irradiated at a relatively high energy level as indicated by the arrows in FIG. 7C. Accordingly, end-of-range vacancies are created between adjacent ones of the trench structures 104 below the body region 110 instead of within the body region 110. The diffused metals occupy the end-of-range vacancies as indicated by label 'M' in FIG. 7D by performing a second diffusion process step at a higher temperature. The high temperature second diffusion process anneals out damage caused to the gate insulator region of the trenches 104 during the previous high-energy irradiation treatment.

According to the metal diffusion embodiments described herein, the homogenous metal diffusion profile results in an optimum decrease of the stored charge of the integrated diode of the RC-IGBT. Particularly, the metal diffusion profile, in conjunction with the availability of end-of-range vacancies between adjacent ones of the transistor gate structures 102, yield a significantly higher concentration of potentially electrically-active metals as opposed to simply diffusing metals into the substrate 106 without any substrate irradiation. Moreover, the specific characteristics of the diffused metals, in particular the energy levels within the band gap and the capture cross section, have a positive effect on the electrical characteristics of the RC-IGBT.

That is, any irradiation damage caused in the gate insulator 112 or at the border between the body region 110 and gate insulator 112 are mostly repaired when the substrate 106 is annealed at a relatively high temperature for redistributing the interstitial metal atoms into the end-of-range vacancies. As such, instabilities in the threshold voltage of the IGBT during operation are significantly reduced. In addition, the secondary defect complexes created by conventional irradiation techniques and low temperature treatment are effectively repaired during high-temperature annealing. Hence, undesirable doping effects resulting from the irradiation processing are corrected without negatively influencing the recombination effect.

Figure 8:
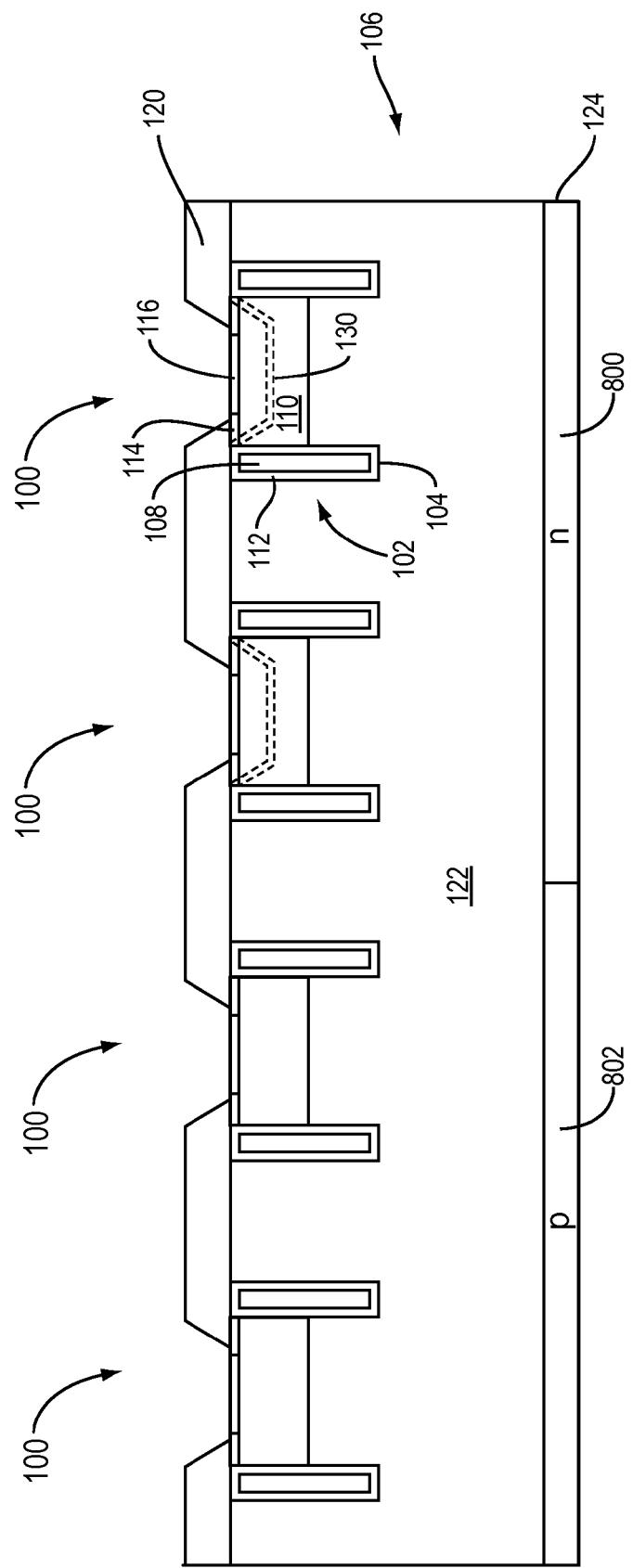
FIG. 8 is a cross-sectional view of an embodiment of several power semiconductor devices fabricated on the same substrate.
Figure 9:
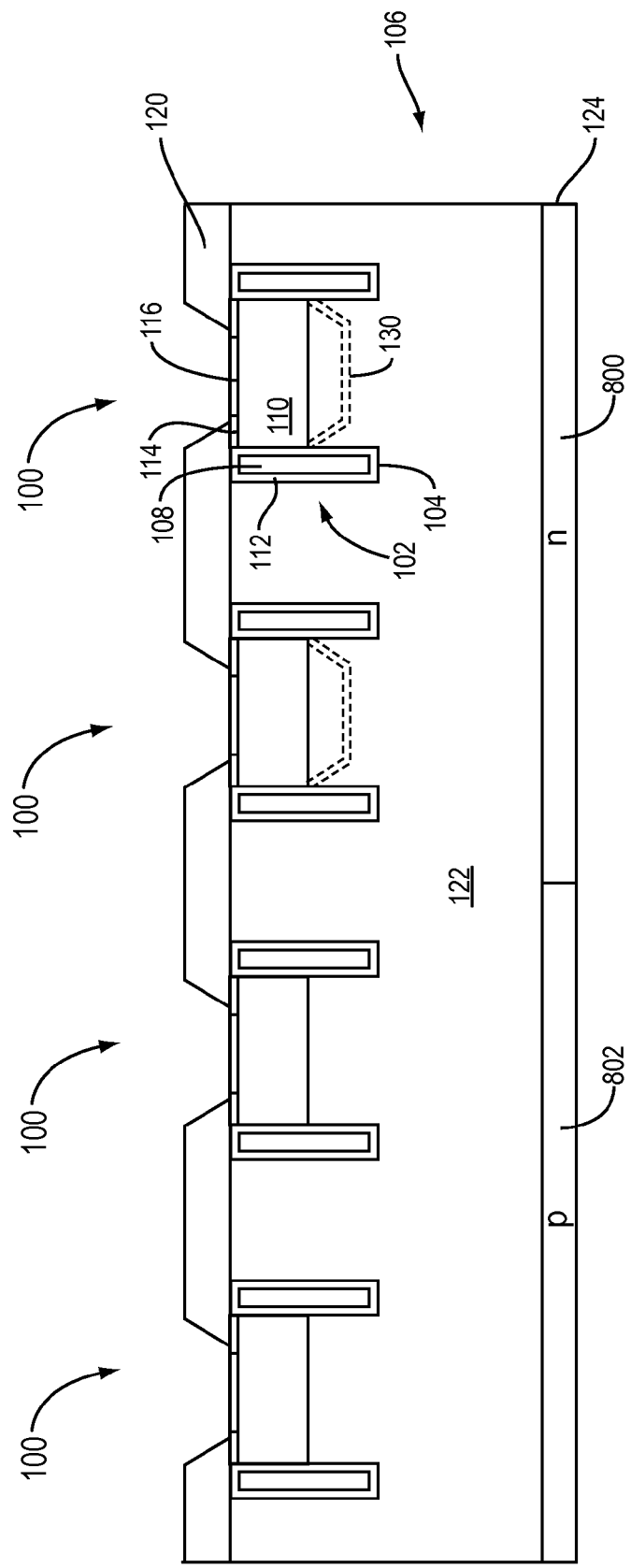
FIG. 9 is a cross-sectional view of another embodiment of several power semiconductor devices fabricated on the same substrate.
Figure 10:
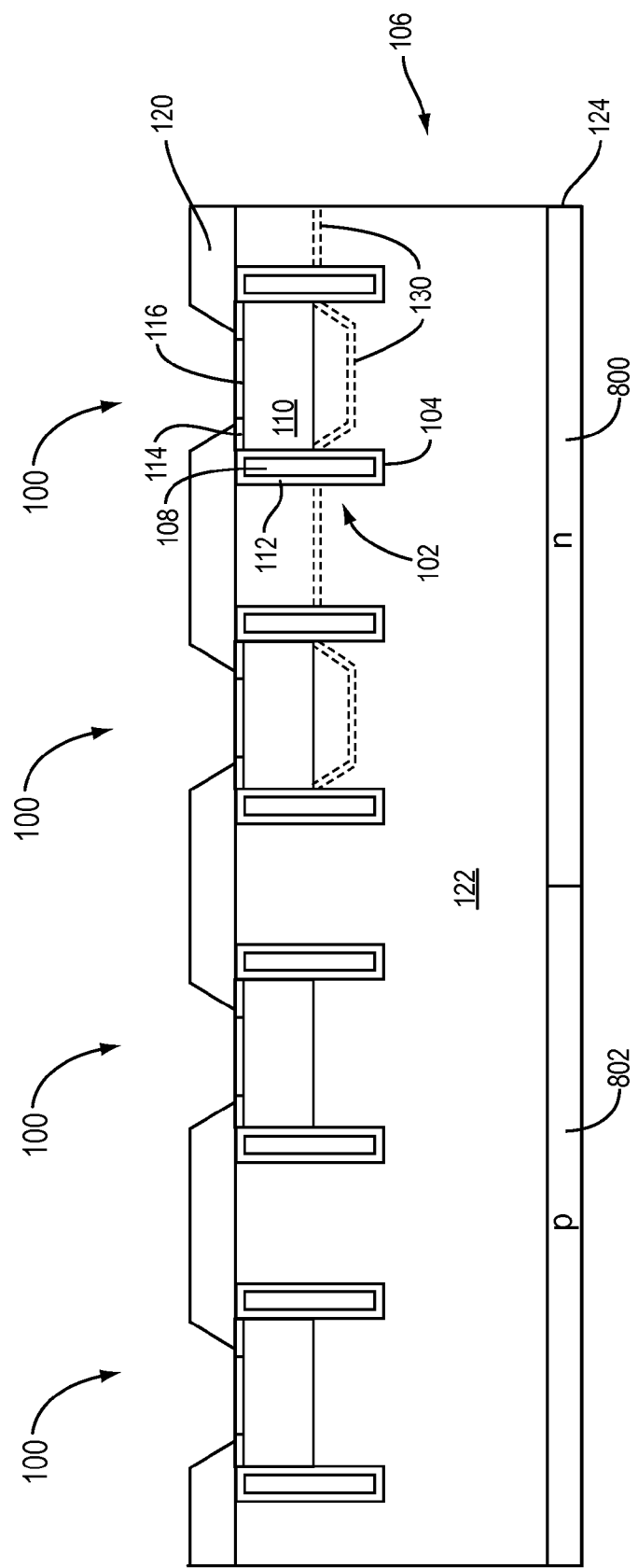
FIG. 10 is a cross-sectional view of yet another embodiment of several power semiconductor devices fabricated on the same substrate.

FIG. 8 illustrates an embodiment of several of the power semiconductor devices 100 fabricated on the same substrate 106. According to this embodiment, the end-of-range region irradiation regions 130 are arranged in the body regions 110. Alternatively, the end-of-range region irradiation regions 130 may arranged below the body regions 110 between adjacent ones of the transistor gate structures 102 as shown in FIGS. 9 and 10. In either embodiment, the highly-doped collector contact region 124 formed below the drift zone 122 comprises an n-type region 800 arranged under some of the transistor gate structures 102 and a p-type region 802 arranged under the other transistor gate structures 102. The end-of-range irradiation regions 130 are arranged above the n-type region 800 of the highly-doped collector contact region 124, but not above the p-type region 802. The gate conductor 108 above the n-type region 800 is connected to the gate conductor above the p-type region 802. Alternatively the gate conductor 108 above the n-type region 800 is not connected to the gate conductor above the p-type region 802, but connected to the emitter contact layer 118.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a reduced free-charge carrier lifetime semiconductor structure, the method comprising:
   forming a plurality of transistor gate structures in trenches arranged in a semiconductor substrate;
   forming a body region between adjacent ones of the transistor gate structures; and
   forming an insulator layer along the semiconductor substrate;
   forming an opening in the insulator layer such that the insulator layer covers adjacent ones of the transistor gate structures and exposes a region of the substrate that is between the adjacent ones of the transistor gate structures;
   forming an end-of-range irradiation region between the adjacent ones of the transistor gate structures by irradiating the semiconductor substrate, the end-of-range irradiation region having a plurality of vacancies,
   wherein the insulator layer is used as a mask for irradiating the semiconductor substrate such that irradiated particles pass through the opening formed in the insulating layer but are prevented by the insulator layer from damaging gate insulators disposed on inner walls of the trenches, and
   wherein the opening in the insulator layer is formed such that sidewalls of the opening form an oblique angle with an upper surface of the substrate, and wherein forming the end-of-range irradiation region comprises passing the irradiated particles through the sidewalls of the region such that the end-of-range irradiation region forms a well-shaped region within the semiconductor substrate, wherein the well-shaped region comprises sidewalls that are parallel to the sidewalls of the opening and directly adjoin outer walls of the gate trenches.

2. The method of claim 1, wherein forming the end-of-range irradiation region between adjacent ones of the transistor gate structures comprises forming the end-of-range irradiation region in the body region between adjacent ones of the transistor gate structures.

3. The method of claim 1, wherein forming the end-of-range irradiation region between adjacent ones of the transistor gate structures comprises forming the end-of-range irradiation region below the body region between adjacent ones of the transistor gate structures.

4. The method of claim 1, further comprising forming a resist layer on the insulating layer before the opening is formed in the insulating layer.

5. The method of claim 4, wherein forming the end-of-range irradiation region between adjacent ones of the transistor gate structures comprises irradiating the semiconductor substrate through the resist layer and the opening formed in the insulating layer.

6. The method of claim 4, wherein forming the end-of-range irradiation region between adjacent ones of the transistor gate structures comprises:
   forming an opening in the resist layer in a region of the opening formed in the insulating layer such that the resist covers adjacent ones of the transistor gate structures and exposes a region of the substrate that is between the adjacent ones of the transistor gate structures; and
   irradiating the semiconductor substrate through the openings formed in the resist and insulating layers,
   wherein the resist is used as an additional mask for irradiating the semiconductor substrate such that irradiated particles pass through the opening formed in the resist.

7. The method of claim 1, further comprising occupying at least some of the vacancies in the end-of-range irradiation region with metals.

8. The method of claim 7, wherein occupying at least some of the vacancies in the end-of-range irradiation region with metals comprises:
   diffusing the metals into the semiconductor substrate; and
   annealing the semiconductor substrate at a relatively high temperature.

9. The method of claim 8, wherein diffusing the metals into the semiconductor substrate comprises:
   forming a metal suicide layer on the semiconductor substrate or implanting metal into the semiconductor substrate; and
   heating the semiconductor substrate.

10. The method of claim 9, wherein the semiconductor substrate is heated to a temperature ranging between approximately 600° and 800° C. for a duration ranging between approximately 30 minutes and 120 minutes.

11. The method of claim 8, wherein the metals are diffused into the semiconductor substrate before the end-of-range irradiation region is formed.

12. The method of claim 11, wherein the metals are diffused into the semiconductor substrate before the end-of-range irradiation region is formed at a temperature ranging between approximately 700° and 900° C. for a duration ranging between approximately 30 minutes and 120 minutes.

13. The method of claim 1, further comprising forming a contact layer that extends from the body region to a surface of the semiconductor substrate using the opening in the insulator layer, wherein the contact layer is formed after forming the end-of-range irradiation region.

14. A method of manufacturing a power semiconductor device, the method comprising:
   providing a semiconductor substrate;
   forming a transistor gate structure in a trench arranged in the semiconductor substrate;
   forming a body region of a first conductivity type adjacent the transistor gate structure;
   forming a first highly-doped region of a second conductivity type in an upper portion of the body region;
   forming a drift zone of the second conductivity type below the body region;
   forming a second highly-doped region of the second conductivity type below the drift zone;
   forming an insulator layer along the semiconductor substrate;
   forming an opening in the insulator layer such that the insulator layer covers the transistor gate structure and exposes a region of the substrate that is adjacent to the transistor gate structure, and
   forming an end-of-range irradiation region adjacent the transistor gate structure by irradiating the semiconductor substrate, the end-of-range irradiation region having a plurality of vacancies,
   wherein the insulator layer is used as a mask for irradiating the semiconductor substrate such that irradiated particles pass through the opening formed in the insulating layer but are prevented by the insulator layer from damaging gate insulators disposed on inner walls of the trenches, and wherein the opening in the insulator layer is formed such that sidewalk of the opening form an oblique angle with an upper surface of the substrate, and wherein forming the end-of-range irradiation region comprises passing the irradiated particles through the sidewalls of the region such that the end-of-range irradiation region forms a well-shaped region within the semiconductor substrate, wherein the well-shaped region comprises sidewalls that are parallel to the sidewalls of the opening and directly adjoin outer walls of the gate trenches.

15. The method of claim 14, wherein forming the end-of-range irradiation region adjacent the transistor gate structure comprises forming the end-of-range irradiation region in the body region adjacent the transistor gate structure.

16. The method of claim 14, wherein forming the end-of-range irradiation region adjacent the transistor gate structure comprises forming the end-of-range irradiation region below the body region in the drift zone adjacent the transistor gate structure.

17. The method of claim 14, further comprising occupying at least some of the vacancies in the end-of-range irradiation region with metals.

18. The method of claim 14, further comprising forming a contact layer that extends from the body region to a surface of the semiconductor substrate, using the opening in the insulator layer, wherein the contact layer is formed after forming the end-of-range irradiation region.

19. A method of manufacturing a reduced free-charge carrier lifetime semiconductor structure, the method comprising:
    forming a plurality of transistor gate structures in trenches arranged in a semiconductor substrate;
    forming a body region between adjacent ones of the transistor gate structures; and
    forming an insulator layer along the semiconductor substrate;
    forming an opening in the insulator layer such that the insulator layer covers adjacent ones of the transistor gate structures and exposes a region of the substrate that is between the adjacent ones of the transistor gate structures;
    forming an end-of-range irradiation region between the adjacent ones of the transistor gate structures by irradiating the semiconductor substrate, the end-of-range irradiation region having a plurality of vacancies,
    wherein only the insulator layer is used as a mask for irradiating the semiconductor substrate such that irradiated particles pass through the opening formed in the insulating layer but are prevented by the insulator layer from damaging gate insulators disposed on inner walls of the trenches, and
    wherein the irradiated particles directly contact an exposed outer surface of the insulator layer mask during formation of the end-of-range irradiation region.

* * * * *